United States Patent
Miyata et al.

[11] Patent Number: 5,888,846
[45] Date of Patent: Mar. 30, 1999

[54] METHOD FOR MICROFABRICATING DIAMOND

[75] Inventors: Koichi Miyata; Koji Kobashi; Kohei Suzuki; Toshihisa Nozawa, all of Kobe, Japan

[73] Assignee: Kabushiki Kaisha Kobe Seiko Sho, Kobe, Japan

[21] Appl. No.: 86,561

[22] Filed: May 29, 1998

[30] Foreign Application Priority Data

May 29, 1997 [JP] Japan .................................. 9-140680

[51] Int. Cl.[6] .................. H01L 21/00; H01L 21/335; H01L 21/84
[52] U.S. Cl. ................. 438/105; 438/142; 438/150
[58] Field of Search ........................ 438/105, 142, 438/150; 257/77

[56] References Cited

U.S. PATENT DOCUMENTS

| | | | |
|---|---|---|---|
| 5,023,204 | 6/1991 | Adachi et al. | 437/228 |
| 5,037,876 | 8/1991 | Birkle et al. | 524/496 |
| 5,139,970 | 8/1992 | Yamazaki | 437/184 |
| 5,262,246 | 11/1993 | Nishikawa et al. | 428/500 |
| 5,492,730 | 2/1996 | Balaba et al. | 427/387 |
| 5,527,562 | 6/1996 | Balaba et al. | 427/430 |
| 5,753,523 | 5/1998 | Giedd et al. | 437/18 |
| 5,780,163 | 7/1998 | Camilletti et al. | 428/446 |
| 5,783,303 | 7/1998 | Tsuei | 428/354 |

*Primary Examiner*—John F. Niebling
*Assistant Examiner*—Christopher Lattin
*Attorney, Agent, or Firm*—Oblon, Spivak, McClelland, Maier & Neustadt, P. C.

[57] ABSTRACT

A method for microfabricating diamond includes the steps of: forming a resist layer composed of a ladder silicone spin-on glass material on the surface of diamond; performing lithography, in which the resist layer is irradiated with an electron beam or an ion beam in a given pattern; developing the resist layer to form the given pattern; and etching diamond by an ECR plasma etching method or a high-frequency plasma etching method.

14 Claims, 4 Drawing Sheets

METHOD FOR MICROFABRICATING DIAMOND

BACKGROUND OF THE INVENTION

1. Field of the Invention

The present invention relates to a method for microfabricating diamond, including a step for etching diamond which is a suitable material for electronic devices used at high temperatures, at high frequencies, and in high electric fields.

2. Description of the Related Art

Diamond has excellent heat-resistance and has a wide band gap of 5.5 eV. It is generally an insulator, however, it can function as a semiconductor when doped with an impurity. Also, diamond has excellent electrical characteristics, such as a high dielectric breakdown voltage, a high saturation velocity and a low dielectric constant. Because of these characteristics, diamond is expected to be a suitable material for electronic devices or sensors with high output, which are used at high temperatures, at high frequencies, and in high electric fields. Also, diamond has been applied to the following fields: as an optical sensor or a light emitting device for the short wavelength range of ultraviolet rays or the like, because of the wide band gap; as a material for a heat dissipating substrate because of its high thermal conductivity and low specific heat; as a surface acoustic device by making use of the characteristic that diamond is the hardest substance; as an X-ray window or optical material because of its high transmittance and refractive index; and so on. Also, diamond is used as a material for tools and micromachinery because of its high wear resistance.

A single crystal of diamond is obtained by mining for natural diamond or by synthesizing it at high temperatures and pressures. A single crystal of diamond, however, has areas of approximately 1 $cm^2$ at the largest, and the price is significantly high. Fields in which diamond is industrially used, therefore, are limited to specific ones such as for polishing powder or as an edge-tool for precision cutting.

Conventionally, various methods of diamond film synthesis have been studied, including, for example, a micro-wave chemical vapor deposition (CVD) method disclosed in Japanese Patent Publication Nos. 59-27754 and 61-3320, a high-frequency plasma CVD method, a hot filament CVD method, a direct-current plasma CVD method, a plasma-jet method, a combustion method, and a thermal CVD method. In accordance with these vapor phase synthesis methods, a large area of diamond film can be obtained with low production costs.

It is a requirement that the surface of a diamond be microfabricated by etching when it is to be used as a core material for practical purposes, as disclosed by K. Kobashi, S. Miyauchi, K. Miyata, K. Nishimura, Journal of Materials Research, Vol. 11, No.11 (1996) p.2744. In particular, in order to apply diamond to electronic devices such as field effect transistors and the like, it is a requirement that diamond is microfabricated in the submicron range (1 $\mu$m or less), as disclosed by K. Miyata et al, in IEEE Trans. Electron Devices, Vol. 42, No.11 (1995) p.2010.

The conventional method for fabricating a diamond semiconductor device includes the steps of: forming a resist layer by applying a resist (photosensitive material) onto a diamond film or substrate; projecting a pattern which has been delineated on a photomask beforehand onto the resist layer with a light source such as a mercury lamp which emits ultraviolet rays; transferring the pattern onto the resist layer by developing it; and patterning by etching the diamond film or substrate with the transferred pattern being used as a mask. After the completion of the patterning of the diamond film or substrate, the resist layer is decomposed and removed by oxygen plasma.

In the photolithography step where the pattern is transferred onto the resist layer, the i-line having a wavelength of 365 nm which is the emission line of the mercury lamp as a light source of the photolithography, and ultraviolet rays having a short wavelength such as a KrF excimer laser having a wavelength of 248 nm are used. However, differing from silicon, diamond transmits light having a wavelength of 220 nm or more in accordance with the band gap. As a result, after the i-lines having a wavelength of 365 nm or the ultraviolet rays having a short wavelength such as a KrF excimer laser having a wavelength of 248 nm pass through the mask, a part of the lines or rays passes through the diamond film, is reflected from the rear towards the surface, and exposes the resist layer. This causes the problem of the mask pattern being transferred incorrectly.

Further, since a lower limit of a line pattern width which is transferable by photolithography, that is, a resolution limit, depends on a wavelength of a light source, it is difficult to form a pattern having a line width of 100 nm or less even if the i-line from a mercury lamp and short-wavelength ultraviolet rays of a KrF excimer laser or the like are used.

The method for making a silicon semiconductor device generally employs an electron beam or ion beam having an acceleration energy of 20 to 200 keV instead of ultraviolet rays in order to form a fine pattern having a line width of 100 nm or less. In electron beam lithography or ion beam lithography which employs an electron beam or ion beam, a pattern is directly delineated on a resist layer with an electron beam or ion beam without a photomask. As a resist which is suitable for these lithographic techniques, polymethyl methacrylate (hereinafter referred to as PMMA) has been known. However, PMMA has a disadvantage of weak resistance to the plasma etching.

Conventionally, a spin-on glass (hereinafter referred to as "SOG") material has been used as an insulating coating film. Recently, it was proposed that the SOG film be used as a negative resist because the SOG material is dehydrated and condensed by irradiation with an electron beam or ion beam and changes into a silicon oxide which is insoluble in an organic solvent, as disclosed by A. Imai, H. Fukuda, T. Ueno, Jpn. J. Appl. Phys. Vol. 29 (1990) P.2653; Y. Koh, T. Goto, J. Yanagisawa, K. Gamo, Jpn. J. Appl. Phys. Vol. 31 (1992) p.4479.

FIG. 8 is an example of a chemical structure of the SOG material. In FIG. 8, four hydroxyl groups are bonded to a silicon (Si), and this is called a straight-chain SOG material including a chemical structure in which hydroxyl groups are substituted for methyl groups. When a SOG film is used as a resist, an organic solvent, for example, methanol or butanol, is used as a developer. A SOG pattern formed as described above can be used as an etching mask as it is, and also can be used as an overlying resist in a multi-layered resist, as disclosed in Japanese Patent Publication No.3-287163. Also, in phase-shift lithography which is a technique used to improve the resolution of photolithography, a shifter composed of a silicon oxide layer is formed on a photomask, and it is also possible to employ the patterning method using the SOG material in order to correct defects in the fabrication process.

The dehydration-condensation reaction of the straight-chain SOG material, however, progresses gradually in air and in a vacuum as time passes, even without being irradiated with an electron beam or ion beam. Hence, in the conventional patterning method using the SOG material, irradiation with an electron beam or an ion beam, and the development, must be completed within 7 hours after the SOG application, which is disadvantageous to the fabrication process. For example, in an experiment conducted by the present inventors, in which the straight-chain SOG material is used to confirm the problem described above, after applying the straight-chain SOG material to a sample followed by soft-baking at a temperature of 80° C. for 5 minutes, the sample with the SOG material was left to stand. As a result, the straight-chain SOG material was found to already be insoluble in the solvent in 8 hours and could not be provided for patterning.

As described above, the patterning method using the SOG material has a problem in the fabrication process, that is, since the SOG material becomes insoluble as time passes, a series of steps, including the application of the straight-chain SOG material, irradiation with an electron beam or an ion beam, and the development, must be performed promptly. Also, it has another problem, that is, since the dehydration-condensation reaction of the applied straight-chain SOG material progresses as time passes, the unreacted SOG material, which is soluble in the developer, decreases as time passes during the development for patterning, and therefore, the size of the pattern formed by electron beam or ion beam irradiation changes with time.

SUMMARY OF THE INVENTION

The present invention has been carried out in view of the problems described above. It is an object of the present invention to provide a method for microfabricating diamond which improves the stability and reproducibility of a pattern size and enables microfabricating of the surface of diamond in the submicron range, without any constraints of time during the patterning process, by preventing a change in the pattern size with time until the development.

A method for microfabricating diamond in accordance with the present invention includes the steps of: forming a resist layer composed of a ladder silicone spin-on glass material on the surface of diamond; performing lithography in which the resist layer is irradiated with an electron beam or ion beam in a given pattern; developing the resist layer to form the given pattern; and etching the diamond by an ECR plasma etching method.

Also, a method for microfabricating diamond in accordance with the present invention includes the steps of: forming a resist layer composed of a ladder silicone spin-on glass material on the surface of diamond; performing lithography in which the resist layer is irradiated with an electron beam or ion beam in a given pattern; developing the resist layer to form a given pattern; and etching the diamond by a high-frequency plasma etching method.

In the present invention, an etching pattern of the diamond may have a width of 1 $\mu$m or less, and also an aspect ratio of 1.0 or more.

The diamond film or substrate may be selected from a natural diamond, bulk diamonds synthesized at high temperatures and pressures, or a diamond film formed by a vapor phase synthesis method, and in any one of the above cases the microfabrication can be performed. In particular, when a diamond film formed by a vapor phase synthesis method is selected, it is preferable that a diamond crystal has an orientation of (111) or (100) because etching is achieved more uniformly. Further, the diamond may be an undoped intrinsic diamond, a semiconducting diamond doped with an impurity element, or a mixture thereof.

In the present invention, a resist layer is formed by applying a ladder silicone SOG material onto the surface of diamond and a given pattern is delineated by electron beam or ion beam radiation onto the resist layer. As a result, the resist layer has an excellent stability with time, time constraints during the patterning step can be eliminated, and a pattern having excellent stability and reproducibility in terms of size can be formed even in the case of a fine pattern, for example, having a line width of 100 nm or less. Also, the method for patterning diamond enables the formation of an etching pattern with a width of 1 $\mu$m or less on the diamond surface, and also allows the aspect ratio, which is a ratio of the etching depth to the width on the diamond surface, that is, (etching depth)/(etching width), to be 1.0 or more.

DESCRIPTION OF THE PREFERRED EMBODIMENTS

Figure 1:
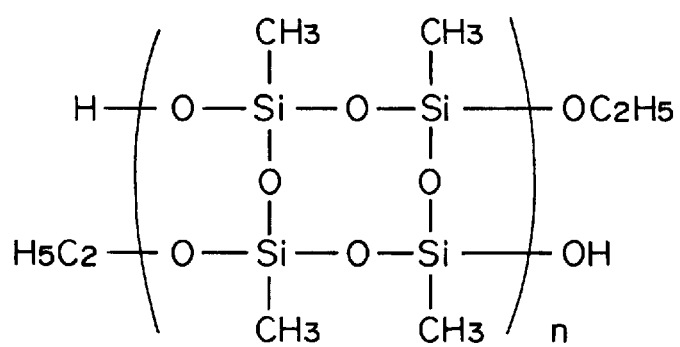
FIG. 1 is a schematic diagram showing the chemical structure of a ladder silicone SOG material.

The present inventors have conducted various experiments and studies to develop a method for patterning, wherein the pattern size has excellent stability and reproducibility with time without time constraints during the patterning process. As a result, it has been found that the object of the present invention can be achieved by using a ladder silicone SOG material for the resist material. FIG. 1 is a schematic diagram showing the chemical structure of a ladder silicone SOG material. The ladder silicone SOG material is composed of Si atoms bonded like a ladder. For example, the ladder silicone SOG material shown in FIG. 1 includes a ring composed of 4 silicon atoms with 4 oxygen atoms lying between each silicon atom, 4 methyl groups bonded to each silicon atom, and OH and $OC_2H_5$ which bond to the other ring. This type of ladder silicone SOG material has excellent stability with time. For example, the present inventors conducted experiments to confirm the properties of the ladder silicone SOG material shown in FIG. 1. First, the ladder silicone SOG material was applied onto the surface of a diamond sample followed by soft-baking at a temperature of 80° C. for 5 minutes, and then was left to stand for 72 hours. Next, the solubility of the ladder silicone SOG material in butanol was checked and found that the ladder silicone SOG material was still soluble in butanol and was not dehydrated or condensed.

Also, the ladder silicone SOG material was applied onto the surface of another diamond sample followed by soft-baking at a temperature of 80° C. for 5 minutes. Then, 14 hours later, a Ga$^+$ ion beam having an acceleration energy of 100 keV in vacua was radiated with a dose of $1\times10^{13}/\text{cm}^2$ onto the ladder silicone SOG film in a given pattern. Further, 20 hours later, the sample with the ladder silicone SOG material was immersed in butanol. As a result, the ladder silicone SOG in an area which had not been irradiated with the ion beam was removed by dissolution. On the other hand, the ladder silicone SOG in an area which had been irradiated with the ion beam remained without dissolving, and the given pattern was obtained. Further, when the same experiments were conducted by using a straight-chain SOG material, the entire straight-chain SOG film was insoluble in butanol and a pattern was not formed. Accordingly, in the present invention, a resist layer is formed by using a ladder silicone SOG material.

Figure 2A:
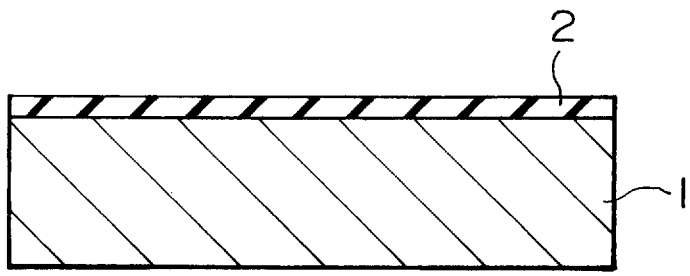
FIG. 2A, FIG. 2B and FIG. 2C are sectional views showing in steps a method for patterning in accordance with a first embodiment of the present invention.
Figure 2B:
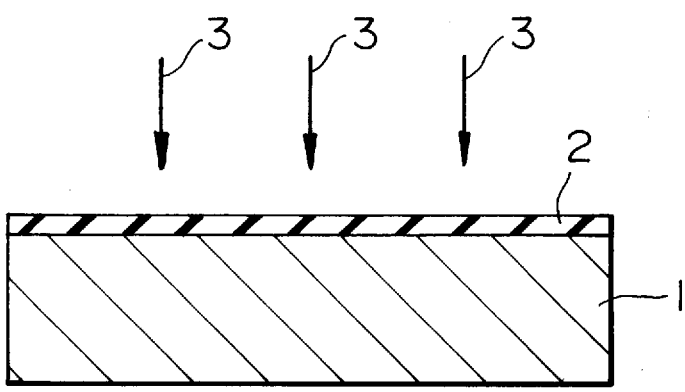
Figure 2C:
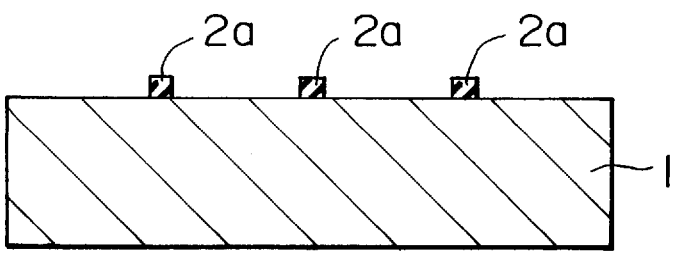
Figure 3:
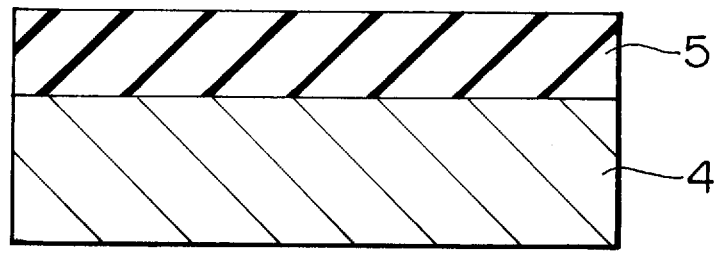
FIG. 3 is a sectional view showing a step in a method for patterning in accordance with a second embodiment of the present invention.

Next, the preferred embodiments in accordance with the present invention will be explained in detail with reference to the attached drawings. FIGS. 2A, 2B and 2C are sectional views showing in steps a method for patterning in accordance with a first embodiment of the present invention. This embodiment uses a ladder silicone SOG material as a single resist layer. As shown in FIG. 2A, in the resist formation step, a ladder silicone SOG material is applied, with a thickness of 50–300 nm, onto a diamond substrate 1 provided with a primer layer thereon (not shown in the drawing), to form a resist layer 2. Next, the substrate 1 is baked at a temperature of 80° C. for 5 minutes with a hot plate.

As shown in FIG. 2B, in the lithography step, a Ga$^+$ ion beam 3 having an acceleration energy of 50–300 keV is radiated onto the resist layer 2 with a dose of $10^{11}$–$10^{14}/\text{cm}^2$ using a focused ion beam system. In such a case, the ion beam is selectively radiated only onto the area which functions as a mask when etching the primer layer on the surface of the diamond substrate 1. Then, the ladder silicone SOG material in the resist layer 2 in the area irradiated with the ion beam is dehydrated and condensed, and becomes insoluble in an organic solvent, for example, methanol and butanol.

In the next development step, the diamond substrate 1 and the resist layer 2 are immersed in, for example, butanol for 30 seconds followed by rinsing with pure water for 30 seconds. Thus, as shown in FIG. 2C, the resist layer 2 on the diamond substrate 1 in the area which has been irradiated with the ion beam remains as a resist pattern 2a, and the resist layer 2 in the other area dissolves in butanol. Accordingly, the silicon oxide film, made by the dehydration-condensation reaction of the ladder silicone SOG material, forms the resist pattern 2a in a given pattern.

As described above, in the method for patterning in accordance with the present invention, the resist layer 2 is formed by using the ladder silicone SOG material. Since the dehydration-condensation reaction of the resist layer 2 hardly proceeds in air or in a vacuum, the patterning process is not constrained with time and the size of the pattern formed by irradiation with the ion beam does not change with time, and thus in a fine patterning, for example, with a line width of 100 nm or less, the pattern can be formed with an excellent stability and reproducibility of the size. Accordingly, by using the resist pattern 2a, formed as described above, as a mask, the diamond substrate 1 can be finely etched with a line width in the submicron range.

FIGS. 3, 4, 5, 6 and 7 are sectional views, showing in steps a method for patterning in accordance with a second embodiment of the present invention. In this embodiment, the present invention is applied to the patterning by a multi-layered resist method, in which a ladder silicone SOG material is used as an overlying resist layer. First, referring to FIG. 3, an underlying resist layer 5 is formed on a diamond substrate 4 provided with a primer layer thereon, by applying a general novolac resist (photo resist) material with a thickness of approximately 1 μm. Then, the diamond substrate 4 is baked at a temperature of 150° to 300° C. for 5 to 20 minutes with a hot plate.

Figure 4:
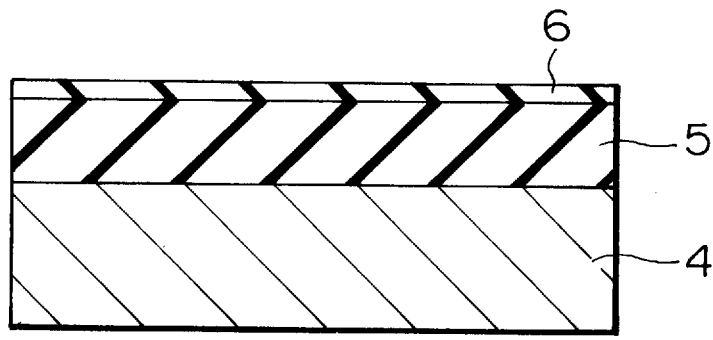
FIG. 4 is a sectional view showing another step in the method for patterning in accordance with the same.
Figure 5:
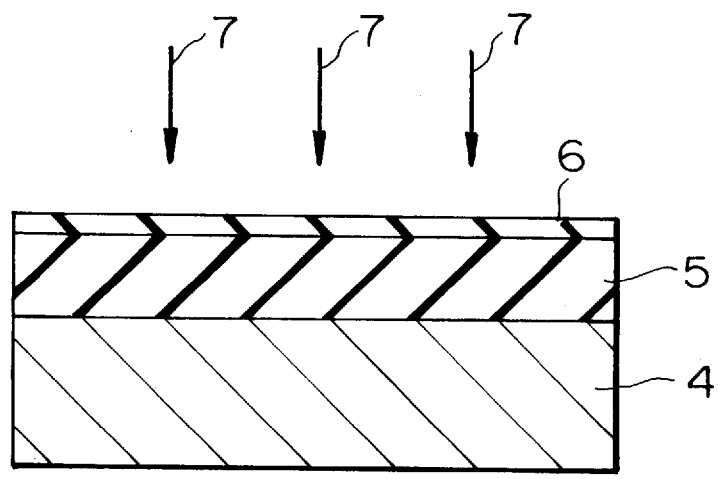
FIG. 5 is a sectional view showing still another step in the method for patterning in accordance with the same.

Next, referring to FIG. 4, an overlying resist layer 6 is formed on the underlying resist layer 5 by applying a ladder silicone SOG material with a thickness of 50 to 200 nm, followed by baking at a temperature of 80° C. for 5 minutes with a hot plate. Then, as shown in FIG. 5, a Ga$^+$ ion beam 7 is radiated onto the overlying resist layer 6, with an acceleration energy of 50 to 200 keV and a dose of $10^{11}$ to $10^{14}/\text{cm}^2$ with a focused ion beam system. In such a case, the ion beam is selectively radiated onto an area where the resist layer 6 is to remain. As a result, the ladder silicone SOG material in the area dehydrates and condenses to be insoluble in an organic solution. Since the ladder silicone SOG material hardly dehydrates and condenses with time, the dehydration-condensation reaction does not occur in the area not irradiated with the ion beam.

Figure 6:
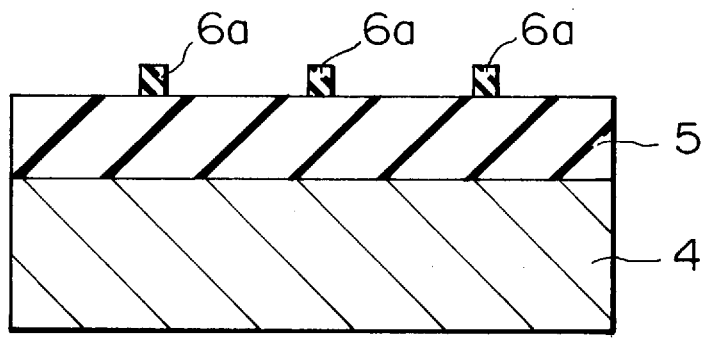
FIG. 6 is a sectional view showing a further step in the method for patterning in accordance with the same.
Figure 7:
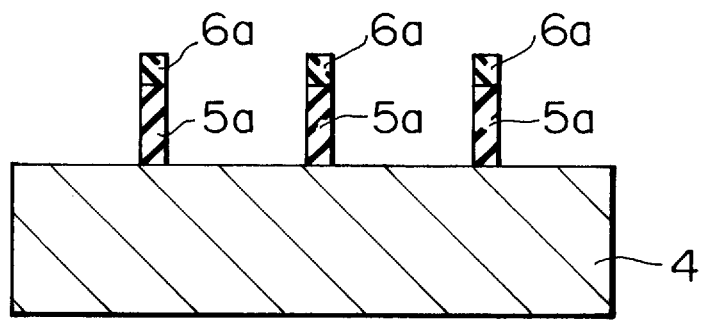
FIG. 7 is a sectional view showing a still further step in the method for patterning in accordance with the same.
Figure 8:
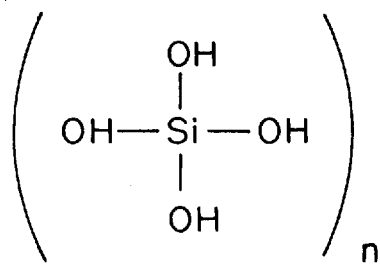
FIG. 8 is a schematic diagram showing the chemical structure of a conventional straight-chain SOG material.

Next, the diamond substrate 4 irradiated with the ion beam is immersed in butanol for 30 seconds followed by rinsing with pure water for 30 seconds. As a result, as shown in FIG. 6, a resist pattern 6a composed of the silicon oxide film made by the dehydration-condensation reaction of the ladder silicone SOG material can be obtained in the given pattern.

In the next step, by etching the underlying resist layer 5 by oxygen plasma etching, using the resist pattern 6a as a mask, a resist pattern 5a, composed of the resist layer 5 which remains just below the resist pattern 6a, can be obtained. The resist pattern 5a can be used as a mask for etching the primer layer. This embodiment can have the same advantages as the first embodiment.

As described above, in accordance with the present invention, a resist layer composed of a ladder silicone SOG material is formed on the surface of diamond and a pattern is formed by radiating an electron beam or an ion beam onto the resist layer, followed by etching the diamond by an ECR or high-frequency plasma etching method. Consequently, the patterning process is not constrained by time and it is possible to prevent a pattern size from changing with time until the development and to improve the stability and the reproducibility of the pattern size. Also, the microfabrication of diamond can be performed in the submicron range so that the surface of diamond can have an aspect ratio of 1.0 or more. Accordingly, the present invention will significantly contribute to the practical use of the diamond semiconducting devices.

What is claimed is:

1. A method for microfabricating diamond, comprising the steps of:

forming a resist layer comprising a ladder silicone spin-on glass material on the surface of diamond;

performing lithography, wherein said resist layer is irradiated with an electron beam or an ion beam in a given pattern;

developing said resist layer to form the given pattern; and etching said diamond by an ECR plasma etching method.

2. A method for microfabricating diamond, comprising the steps of:

forming a resist layer comprising a ladder silicone spin-on glass material on the surface of diamond;

performing lithography, wherein said resist layer is irradiated with an electron beam or an ion beam in a given pattern;

developing said resist layer to form the given pattern; and etching said diamond by a high-frequency plasma etching method.

3. A method for microfabricating diamond according to claim 1 or claim 2, wherein an etching pattern of said diamond has a width of 1 μm or less.

4. A method for microfabricating diamond according to any one of claims 1 to 2, wherein an etching pattern of said diamond has an aspect ratio of 1.0 or more.

5. A method of microfabricating diamond according to any one of claims 1 to 2, wherein said diamond film is a diamond film selected from the group consisting of a natural diamond, a bulk diamond synthesized at a high temperature and pressure, and a diamond film formed by a vapor phase synthesis method.

6. A method for microfabricating diamond according to claim 5, wherein said diamond film formed by said vapor phase synthesis method comprises a diamond crystal having an orientation of (111) or (100).

7. A method for microfabricating diamond according to claim 5, wherein said diamond is a diamond selected from the group consisting of an intrinsic diamond undoped with an impurity element, a semiconducting diamond doped with an impurity element, and a mixture thereof.

8. A method for microfabricating diamond according to claim 3, wherein an etching pattern of said diamond has an aspect ratio of 1.0 or more.

9. A method for microfabricating diamond according to claim 3, wherein said diamond film is a diamond film selected from the group consisting of a natural diamond, a bulk diamond synthesized at a high temperature and pressure, and a diamond film formed by a vapor phase synthesis method.

10. A method for microfabricating diamond according to claim 4, wherein said diamond film is a diamond film selected from the group consisting of a natural diamond, a bulk diamond synthesized at a high temperature and pressure, and a diamond film formed by a vapor phase synthesis method.

11. A method for microfabricating diamond according to claim 9, wherein said diamond film formed by said vapor phase synthesis method comprises a diamond crystal having an orientation of (111) or (100).

12. A method for microfabricating diamond according to claim 10, wherein said diamond film formed by said vapor phase synthesis method comprises a diamond crystal having an orientation of (111) or (100).

13. A method for microfabricating diamond according to claim 11, wherein said diamond is a diamond selected from the group consisting of an intrinsic diamond undoped with an impurity element, a semiconducting diamond doped with an impurity element, and amixture thereof.

14. A method for microfabricating diamond according to claim 12, wherein said diamond is a diamond selected from the group consisting of an intrinsic diamond undoped with an impurity element, a semiconducting diamond doped with an impurity element, and a mixture thereof.

* * * * *